United States Patent [19]

Kimura et al.

[11] Patent Number: 5,674,317
[45] Date of Patent: Oct. 7, 1997

[54] VESSEL MADE FROM PYROLYTIC BORON NITRIDE

[75] Inventors: Noboru Kimura; Kenji Itou, both of Gunma-ken, Japan

[73] Assignee: Shin-Etsu Chemical Co., Ltd., Tokyo, Japan

[21] Appl. No.: 584,806

[22] Filed: Jan. 11, 1996

Related U.S. Application Data

[63] Continuation of Ser. No. 85,607, Jun. 30, 1993, abandoned.

[30] Foreign Application Priority Data

Jul. 2, 1992 [JP] Japan ................................. 4-199264

[51] Int. Cl.$^6$ ................................................. C30B 29/38
[52] U.S. Cl. ........................ 117/208; 117/900; 117/952
[58] Field of Search ................................ 117/900, 952, 117/208

[56] References Cited

U.S. PATENT DOCUMENTS 3,152,006 10/1964 Basche .
4,478,675 10/1984 Akai ........................... 117/900
4,690,841 9/1987 Tanji et al. .................. 117/900
5,032,366 7/1991 Finicle ......................... 117/900
5,158,750 10/1992 Finicle ......................... 117/900

*Primary Examiner*—Robert Kunemund
*Attorney, Agent, or Firm*—McAulay Fisher Nissen Goldberg & Kiel, LLP

[57] ABSTRACT

Proposed is a novel vessel such as crucibles made from PBN (pyrolytic boron nitride), which is highly resistant against exfoliation of the surface layer and suitable for use, for example, as a container of the melt in the Czochralski single crystal growing of III–V Group compound semiconductor single crystals with an improvement in the serviceable life. The PBN-made vessel of the invention is characterized by specific values of several parameters including density, which should be in the range from 1.90 to 2.05 g/cm$^3$, intensity ratio of the X-ray diffraction peaks representing the degree of orientation, heat conductivity coefficient and the like. The above mentioned advantageous serviceable life of the vessel can be obtained only when these parameter values are satisfied.

2 Claims, 3 Drawing Sheets

HEATER POSITION, x, mm

VESSEL MADE FROM PYROLYTIC BORON NITRIDE

This is a continuation of application Ser. No. 08/085,607, filed Jun. 30, 1993 now abandoned.

BACKGROUND OF THE INVENTION

The present invention relates to a vessel made from pyrolytic boron nitride or, more particularly, to a vessel such as a crucible made from pyrolytic boron nitride suitable for use, for example, in the single crystal growing of a compound semiconductor of the III-V Groups in the Periodic Table to prepare a single crystal of a large diameter by the Czochralski method or for use in the process of vacuum vapor deposition, molecular beam epitaxy and the like.

As is known, the so-called liquid-encapsulated Czochralski (LEC) method is undertaken in the single crystal growing process of the III-V Group compound semiconductors such as gallium arsenide and indium phosphide in order to prevent evaporation loss of the constituent elements from the melt contained in a crucible. It is conventional to use a crucible of fused silica in the LEC method but use of a fused silica crucible is unavoidably accompanied by a problem that the single crystal grown thereby is contaminated with silicon coming from the crucible material so that it is usually practiced that the melt contained in the crucible, from which the single crystal is pulled up, is doped with chromium in order to compensate for the influence caused by the silicon contaminant.

The above mentioned doping method of the melt with chromium is not always undertaken in the single crystal growing of compound semiconductors because the single crystal of the compound semiconductor grown from such a chromium-doped melt has a somewhat decreased volume resistivity so that such a single crystal is not suitable as a substrate material of high-performance ICs and LSIs. It has been proposed recently, in order to obtain a single crystal of a compound semiconductor suitable for the substrates of ICs and LSIs without chromium doping, to use a crucible of pyrolytic boron nitride, referred to as PBN hereinbelow, which in itself is a compound of the elements of the IIIrd and Vth Groups not to cause a problem of impurity level formation even if the single crystal of a compound semiconductor is contaminated therewith.

A PBN-made crucible, when used in the single crystal growing process of a compound semiconductor, has a problem or disadvantage that the serviceable life of the crucible is limited to withstand the service of only 10 to 15 times of use in the single crystal growing because laminar exfoliation sometimes takes place on the surface resulting in a great drawback in the industrial production of compound semiconductors. It is important in the LEC method for the Czochralski growing of a large single crystal having a diameter of 6 to 8 inches to exactly control the temperature distribution within the melt contained in a crucible. Similarly, exact control of the temperature distribution in the melt is also required in the HB method and VGF method to make a definite gradient in the temperature.

In the Knudsen cell for the molecular beam epitaxy, it is proposed to make a definite temperature difference between the bottom and the molecular beam exit of the source cell, i.e. MBE cell, so as to decrease the defects in the epitaxially grown film such as over-defects and the like. It is also important in this case to exactly control the temperature difference of the cell portions.

When PBN is used as the material of the crucibles or cells in the above mentioned processes, however, difficulties are encountered in the exact control of the temperature distribution within the melt contained in the vessel of a large size because the heat conductivity of the PBN-made vessel having a laminar structure is 10 to 100 times larger in the direction parallel to the laminated layers or the so-called a-direction than in the direction perpendicular to the laminated layers or the so-called c-direction. This problem is caused by the fact that the conventional PBN has a density of 2.1 to 2.2 g/cm$^3$ which is close to the theoretical density of 2.25 g/cm$^3$ and a structure with a high degree of orientation.

SUMMARY OF THE INVENTION

The present invention accordingly has an object to provide a novel vessel made from PBN, in which the above described disadvantages and defects in the conventional PBN-made vessels are eliminated, as well as to provide a novel method for the preparation of such a PBN-made vessel.

Thus, the PBN-made vessel of the invention is characteristic primarily in the density thereof which is in the range from 1.90 to 2.05 g/cm$^3$. Secondarily, the inventive PBN-made vessel is characterized by the specific degree of orientation defined later in terms of the intensity ratio of the X-ray diffraction peaks of I(002):I(100) for the a-plane and c-plane which is in the range from 5 to 50. Further, the inventive PBN-made vessel is characterized by the heat conductivity which does not exceed 50 W/m.K in the a-direction or the direction parallel to the surface of the laminar layers.

The above defined PBN-made vessel of the invention can be prepared by depositing PBN having a density in the range from 1.90 to 2.05 g/cm$^3$ on the surface of a core mold made from a refractory material by the pyrolytic reaction in a mixture of a boron halide such as boron trichloride and ammonia under a pressure of 1 to 10 Torr or, preferably, 1 to 5 Torr at a temperature in the range from 1800° to 1900° C. or, preferably, from 1800° to 1850° C. The molar ratio of the boron halide and ammonia in the gaseous phase is in the range from 1:2 to 1:5 or, preferably, in the range from 1:3 to 1:4.

DETAILED DESCRIPTION OF THE PREFERRED EMBODIMENTS

The inventors have conducted extensive investigations with an object to solve the above described problems in the conventional PBN-made vessels and have arrived at a discovery that the object can be achieved by a PBN-made vessel having the above described various characteristics followed by the establishment of the method for the preparation of such a PBN-made vessel.

Namely, the PBN-made vessel of the invention can be prepared by depositing PBN formed by the pyrolytic reaction of a boron halide such as boron trichloride and ammonia in a mixing ratio of boron trichloride and ammonia of 1:2 to 1:5 by moles or, preferably, 1:3 to 1:4 by moles under a pressure in the range from 1 to 10 Torr or, preferably, from 1 to 5 Torr at a temperature in the range from 1800° to 1900° C. or, preferably, from 1800° to 1850° C. so that the deposited PBN-made walls of the vessel have the above described specific values of the parameters including the density which is in the range from 1.90 to 2.05 g/cm$^3$.

When the temperature of the pyrolytic reaction is lower than 1800° C., the deposited PBN is in an amorphous, brittle and glassy form so that the vessels prepared under such a temperature condition is susceptible to the formation of cracks not to be usable in practical applications. When the temperature of the pyrolytic reaction is too high, on the other hand, the deposited PBN has a density exceeding 2.05 g/cm$^3$ along with an excessively high degree of crystallization and an excessively high degree of orientation. When the pressure of the reacting gaseous mixture is too high, the space reaction of the gaseous reactants takes place so rapidly that the deposited PBN layer may have an increased number of nodules or protrusions to greatly decrease the uniformity of the vessel walls. When the pressure is too low, on the other hand, the rate of PBN deposition is unduly low so that the desired PBN-made vessels cannot be obtained with an industrially feasible productivity.

Figure 1:
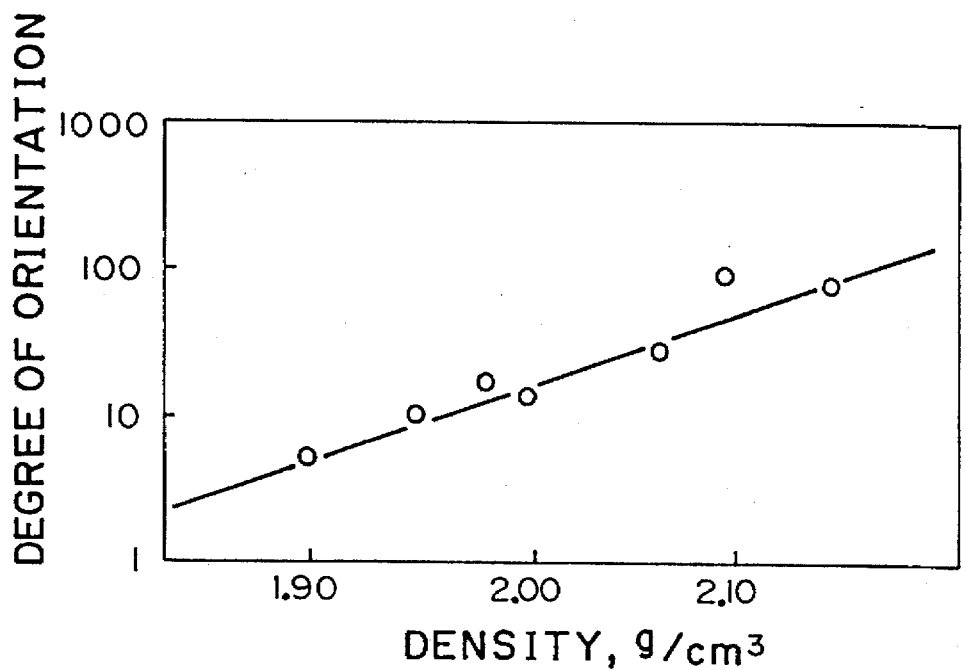
FIG. 1 is a graph showing the degree of orientation in the PBN-made vessel as a function of the density.

It is well known that PBN can be deposited on a refractory core mold of, for example, carbon by the pyrolytic reaction of boron trichloride and ammonia under a reduced pressure at a high temperature. FIG. 1 shows the relationship between the density and the degree of orientation in the wall of PBN deposited in this method. It has been discovered that, when the pyrolytic reaction to deposit PBN is controlled in such a way that the intensity ratio of the X-ray diffraction peaks, i.e. I(002):I(100), of the a-plane and c-plane is in the range from 5 to 50, the density of the PBN falls within the range from 1.90 to 2.05 g/cm$^3$. Namely, the degree of orientation and the density of the deposited PBN depend on the temperature and pressure in the pyrolytic reaction which is conducted in a gaseous mixture of boron trichloride and ammonia in a molar ratio of 1:2 to 1:5 under a reduced pressure in the range from 1 to 10 Torr or, preferably, from 1 to 5 Torr at a temperature in the range from 1800° to 1900° C.

The degree of orientation here implied is defined by the equation:

(degree of orientation)=[I(002)$_a$/I(100)$_a$]/[I(002)$_c$/I(100)$_c$], in which I(002)$_a$ and I(100)$_a$ are each the relative intensity of the X-ray diffraction peaks assignable to the crystallographic (002) plane having a lattice spacing of 0.333 nm and the (100) plane having a lattice spacing of 0.250 nm, respectively, in the X-ray diffraction spectrum taken with X-ray beams incident in a direction perpendicular to the a-plane, i.e. a plane parallel to the layers forming the laminar structure of the vessel walls, and I(002)$_c$ and I(100)$_c$ are each a corresponding value to I(002)$_a$ and I(100)$_a$, respectively, obtained with X-ray beams incident in a direction perpendicular to the c-plane, i.e. a plane perpendicular to the layers forming the laminar structure of the vessel walls, or in the direction of the wall thickness.

Figure 2:
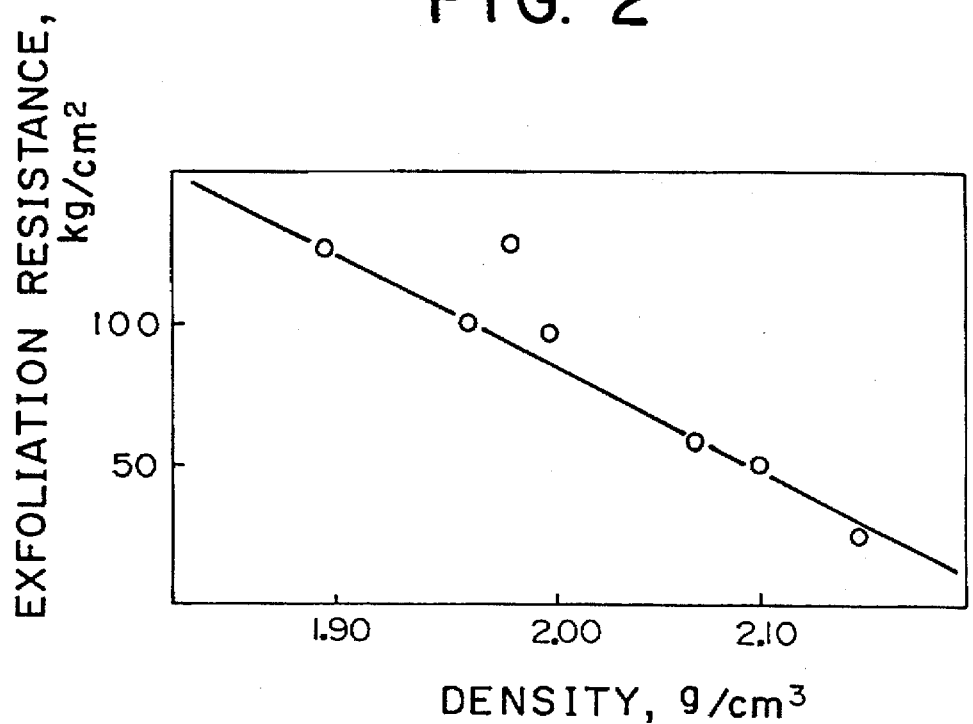
FIG. 2 is a graph showing the exfoliation resistance of the PBN-made vessel as a function of the density.

When the density of the PBN vessel formed by the pyrolytic deposition has a density in the range from 1.90 to 2.05 g/cm$^3$, the vessel wall has a high exfoliation resistance, which can be increased by decreasing the density of PBN as is shown in FIG. 2 for the relationship between the density and the exfoliation resistance determined by the stud method. For example, the exfoliation resistance is 125 kg/cm$^2$ when the density is 1.90 g/cm$^3$ while the exfoliation resistance is decreased to 50 kg/cm$^2$ when the density is increased to 2.05 g/cm$^3$. A PBN-made crucible having such a high value of exfoliation resistance can be used repeatedly in more than 30 times of the single crystal growing processes for the preparation of III-V Group compound semiconductor single crystals since the weight decrease of the crucible prepared in the Example in a single run of the single crystal growing process is only 0.2 g or smaller on an average.

The above mentioned stud method for the determination of the exfoliation resistance is performed in the following way. Thus, a nailhead-like pulling tool consisting of a fiat head disc having a surface area of 0.28 cm$^2$ and a pulling rod perpendicular to the head disc is adhesively bonded at the fiat surface of the head disc to the surface of the PBN-made vessel by using an adhesive and the pulling rod is gently pulled in a direction perpendicular to the surface of the vessel on an automatic tensile testing machine until exfoliation takes place in the vessel wall to determine the pulling force when exfoliation takes place.

Figure 3:
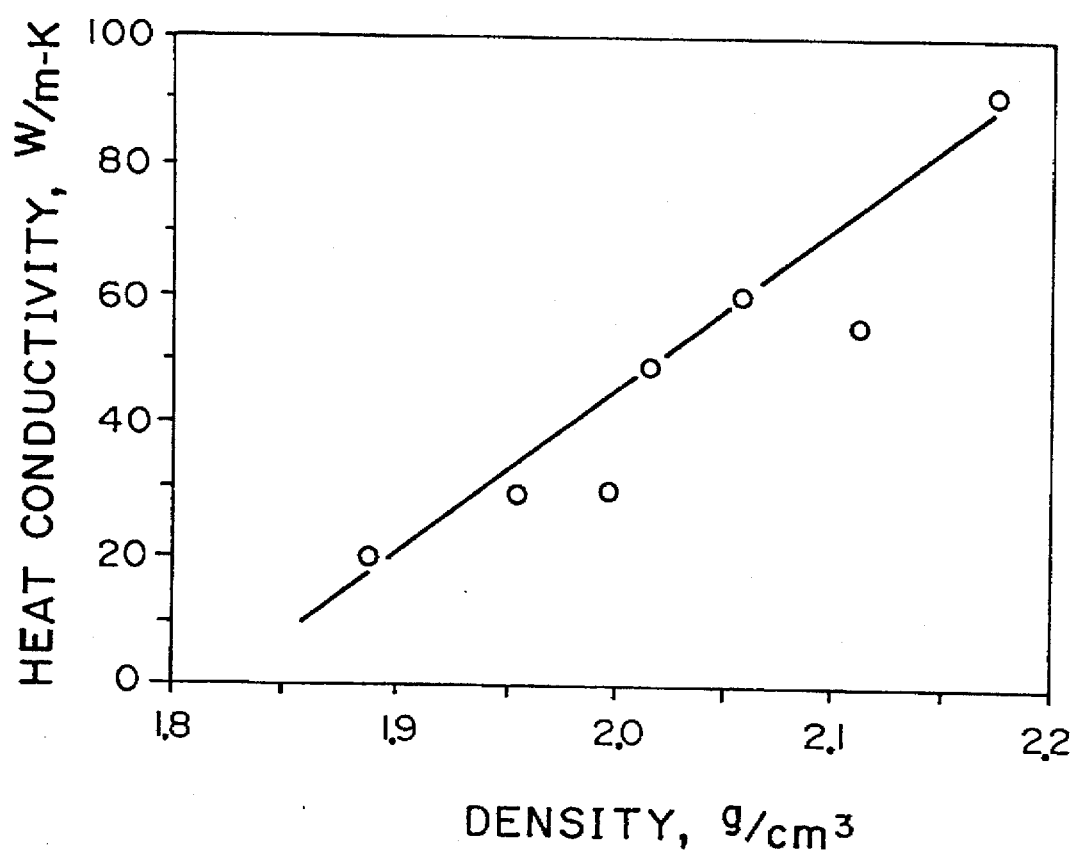
FIG. 3 is a graph showing the heat conductivity of the PBN-made vessel in the direction perpendicular to the surface of the vessel wall with a laminar structure as a function of the density.

Further, the PBN-made vessel having the above specified density has a controlled effective heat conductivity as determined by the laser flash method in the direction within the a-plane. FIG. 3 shows the relationship between the density and the heat conductivity in the direction within the a-plane. As is understood from this graph, the heat conductivity is decreased as the density is decreased. For example, the heat conductivity is 20 W/m.K when the density is 1.90 g/cm$^3$ while the value is 50 W/m.K when the density is 2.05 g/cm$^3$.

The PBN-made vessel can be imparted with good controllability of temperature distribution provided that the density thereof is in the range from 1.90 to 2.05 g/cm$^3$. When the density of the vessel is too high, on the other hand, the uniformity in the temperature distribution is increased as a trend, in particular, in the direction within the a-plane so that a difficulty is encountered in making a temperature gradient, especially, in a relatively large PBN-made vessel.

When the PBN-made vessel has a degree of orientation as defined above lower than 5 and a density lower than 1.90 g/cm$^3$, the tensile strength of the PBN-made vessel cannot be high enough in the direction parallel to the surface of the laminated layers so that the vessel cannot withstand a long term service with stability. When the degree of orientation is larger than 50 and the density is higher than 2.05 g/cm$^3$, the PBN-made vessel has an unduly large anisotropy with a decrease in the exfoliation resistance of the surface so that the serviceable life of the vessel cannot be long enough. Namely, a PBN-made vessel is imparted with sufficiently high exfoliation resistance and an adequately low heat conductivity only when the degree of orientation is in the range from 5 to 50 and the density is in the range from 1.90 to 2.05 g/cm$^3$ so as to be imparted with good controllability of the temperature distribution even in a large vessel so that the vessel has an advantageously long serviceable. life when the vessel is used as a crucible for the Czochralski single crystal growing process in the preparation of III-V Group compound semiconductor single crystals or as a cell for the vacuum vapor-phase deposition or molecular beam epitaxy.

In the following, the PBN-made vessel of the invention is illustrated in more detail by way of examples and comparative examples, in which the durability and temperature-distribution controllability of the vessels were determined by the testing procedures described below.

Durability test:

A PBN-made cylindrical vessel having a diameter of 150 mm and a depth of 100 mm was charged with 200 g of boron oxide $B_2O_3$ which was melted by heating up to 1200° C. and kept at this temperature for 1 hour followed by spontaneous cooling to room temperature. In the course of this cooling, the melt of boron oxide in contact with and adhering to was solidified and the solidified mass of boron oxide is contracted to cause exfoliation on the surface of the vessel wall. The solidified mass of boron oxide was taken out of the vessel and the emptied vessel was immersed in a methyl alcohol bath for 10 hours at room temperature to dissolve away the adhering boron oxide followed by drying and determination of the weight decrease to be recorded as a measure of the durability.

Figure 4:
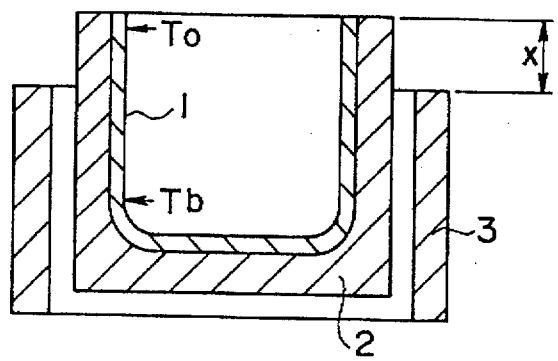
FIG. 4 is a schematic illustration of a cross section of an apparatus for the evaluation of the controllability of temperature distribution in the PBN-made vessel.

Temperature-distribution controllability test:

As is shown in FIG. 4, a PBN-made vessel 1 having an inner diameter of 150 mm, depth of 150 mm and wall thickness of 1.0 mm is placed in a susceptor 2 having a wall thickness of 10 mm made from isotropic high-density carbon and heated therein in an atmosphere of nitrogen gas under normal pressure from outside to keep the core portion of the vessel 1 at 1400° C. by means of a cylindrical carbon heater 3 having an inner diameter of 190 mm and length of 150 mm and thermally insulated outside with a carbon fiber mat, the height of which relative to the PBN-made vessel 1 being adjustable. Measurement of the temperature of the PBN-made vessel 1 was undertaken at the upper periphery of the vessel (temperature $T_o$) and the side point of the bottom (temperature $T_b$) as a function of the varied height x in mm of the carbon heater 3 which was the height difference between the upper periphery of the PBN-made vessel 1 and the upper end of the carbon heater 3.

EXAMPLES 1 TO 3 AND COMPARATIVE EXAMPLES 1 TO 4.

In Examples 1 to 3, a cylindrical carbon mold having a diameter of 150 mm and a height of 200 mm was set in an external-heating chamber for reduced-pressure CVD, into which a gaseous mixture of boron trichloride and ammonia in a molar ratio of 1:3 under a pressure of 1 to 5 Torr and the pyrolytic reaction of the gaseous mixture was conducted at a temperature in the range from 1800° to 1850° C. so as to deposit PBN on the carbon mold until the thickness of the deposited PBN layer was 1 mm followed by removal of the carbon mold to give a PBN-made vessel having a diameter of 150 mm, depth of 200 mm and wall thickness of 1 mm. The PBN-made vessels prepared in the above described manner were each subjected to the measurements of the density, degree of orientation, exfoliation resistance and heat conductivity to give the results shown in Table 1.

In Comparative Example 1, the pyrolytic reaction was conducted under a pressure of 10 Torr and at a temperature of 1780° C., the other conditions being the same as in Example 1. The pyrolytic reaction in Comparative Example 2 to 4 was conducted under a pressure of 0.5 Torr and at a temperature in the range from 1920° to 1950° C., the other conditions being the same as in Example 1. Table 1 also shows the density, degree of orientation, exfoliation resistance and heat conductivity of the PBN-based vessels obtained in Comparative Examples 1 to 4.

The value of "Yield" given in Table 1 is the percentage of successful runs to obtain an acceptable single crystal of gallium arsenide having a diameter of 8 inches in a number of repeated runs for the Czochralski single crystal growing using the PBN-made crucibles having an inner diameter of 200 mm, depth of 180 mm and wall thickness of 1.5 mm.

Figure 5:
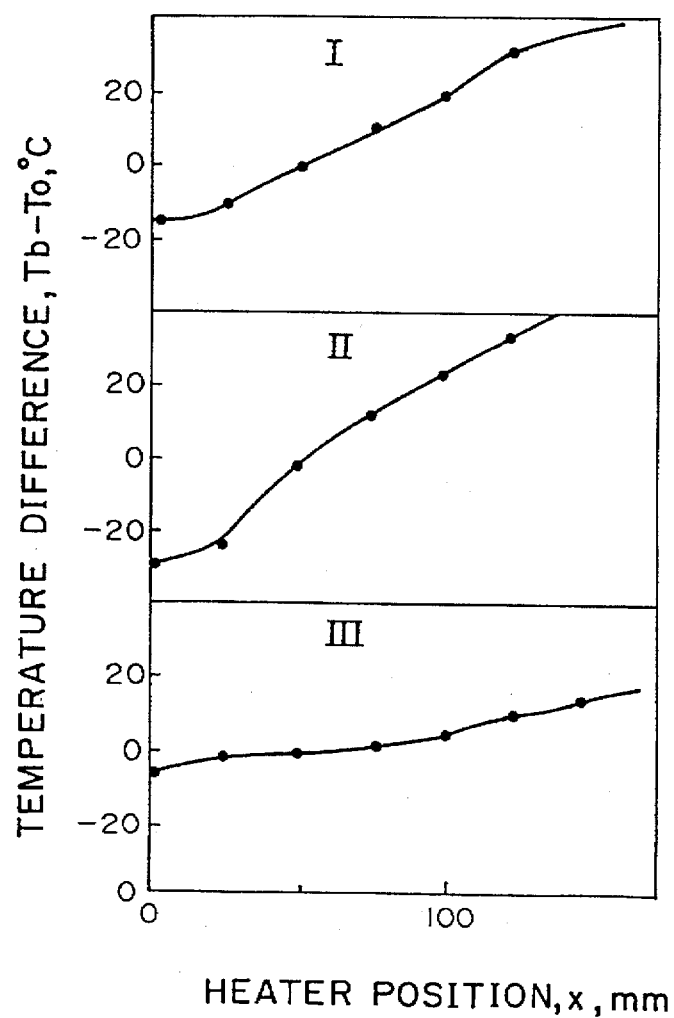
FIG. 5 is a graph obtained in the evaluation tests of the controllability of temperature distribution in the PBN-made vessels, of which curves I, II and III are for the vessels prepared in Example, Comparative Example 1 and Comparative Example 2, respectively.

Further, the PBN-made vessels prepared in the Examples and Comparative Examples were subjected to the test for the controllability of temperature distribution to give the results graphically shown in FIG. 5 giving the temperature difference $(T_b-T_o)$ in °C. as a function of the height difference x in mm between the upper periphery of the PBN-made vessel and the upper end of the carbon heater. The curves I and II of FIG. 5 are for Examples 1 to 3 and for Comparative Example 1, respectively, in which a considerably large temperature difference was obtained indicating that control of the temperature distribution is relatively easy in these vessels to make a temperature gradient while curve III of FIG. 5 for Comparative Examples 2 to 4 shows that the temperature difference is small indicating that control of temperature distribution to make a temperature gradient would be difficult in these PBN-made vessels.

TABLE 1

|  | Example | | | Comparative Example | | | |
|---|---|---|---|---|---|---|---|
|  | 1 | 2 | 3 | 1 | 2 | 3 | 4 |
| Pyrolytic reaction | | | | | | | |
| Temperature, °C. | 1820 | 1820 | 1850 | 1780 | 1920 | 1940 | 1950 |
| Pressure, Torr | 5 | 1 | 1 | 10 | 0.5 | 0.5 | 0.5 |
| PBN vessel (crucible) | | | | | | | |
| Density, g/cm³ | 1.95 | 1.99 | 2.01 | 1.89 | 2.07 | 2.10 | 2.18 |
| Degree of orientation | 10 | 20 | 15 | 4 | 30 | 100 | 100 |
| Exfoliation resistance, kg/cm² | 100 | 130 | 90 | 130 | 55 | 50 | 25 |
| Heat conductivity, W/m · K | 30 | 30 | 35 | 20 | 60 | 55 | 90 |
| Life, times of crystal growing | 32 | 30 | 35 | 2 | 12 | 8 | 7 |
| Yield, % | 96 | 95 | 93 | 85 | 80 | 60 | 50 |

What is claimed is:

1. A vessel made from pyrolytic boron nitride having a density in the range from 1.95 to 2.05 g/cm³ of which the wall has a structure consisting of laminar layers in parallel to the surface of the wall and wherein X-ray beams incident on the vessel wall in a direction perpendicular to the laminar layers and in a direction parallel to the laminar layers give X-ray diffraction peaks of which the intensity ratios express by the equation:

(degree of orientation)=$[I(002)_a/I(100)_a]/[I(002)_c/I(100)_c]$, in which $I(002)_a$ and $I(100)_a$ are each the relative intensity of the X-ray diffraction peaks assignable to the crystallographic (002) plane having a lattice spacing of 0.333 nm and the (100) plane having a lattice spacing of 0.250 nm, respectively, when the X-ray beam is incident in the direction perpendicular to the laminar layers and $I(002)_c$ and $I(100)_c$ are each the relative intensity of the X-ray diffraction peaks assignable to the crystallographic (002) plane having a lattice spacing of 0.333 nm and the (100) plane having a lattice spacing of 0.250 nm, respectively, when the X-ray beam is incident in the direction parallel to the laminar layers, is in the range from 5 to 50.

2. The vessel made from pyrolytic boron nitride as claimed in claim 1 in which the wall of the vessel has a heat conductivity co-efficient not exceeding 50 W/m.K in the direction parallel to the laminar layers.

* * * * *